United States Patent [19]

Satoh

[11] 4,019,112
[45] Apr. 19, 1977

[54] BATTERY CHECKER CIRCUIT
[75] Inventor: Ken Satoh, Hachioji, Japan
[73] Assignee: Olympus Optical Co., Ltd., Tokyo, Japan
[22] Filed: June 25, 1975
[21] Appl. No.: 590,288
[30] Foreign Application Priority Data
  June 28, 1974 Japan .............................. 49-74065
  July 5, 1974 Japan .............................. 49-79415
  July 9, 1974 Japan .............................. 49-80776
[52] U.S. Cl. .................................. 320/48; 340/249
[51] Int. Cl.$^2$ ........................................ H02J 7/02
[58] Field of Search ............ 320/48, 2, DIG. 1, 39, 320/40; 322/99; 340/249

[56] References Cited
UNITED STATES PATENTS

| | | | |
|---|---|---|---|
| 3,321,754 | 5/1967 | Grimm et al. | 320/48 UX |
| 3,350,619 | 10/1967 | Jensen | 320/DIG. 1 |
| 3,708,738 | 1/1973 | Crawford et al. | 320/40 X |
| 3,890,555 | 6/1975 | Nelson et al. | 320/48 X |

OTHER PUBLICATIONS
"G. E. Transistor Manual," 7th Edition, 8/64, p. 401.

Primary Examiner—Robert J. Hickey
Attorney, Agent, or Firm—Ostrolenk, Faber, Gerb & Soffen

[57] ABSTRACT

A battery checker circuit comprises a voltage divider connected across a storage battery and including a voltage detection resistor. The voltage developed across the detection resistor is sensed by a transistor, which conducts to energize a display element when the battery voltage is above a reference voltage. For a battery voltage below the reference voltage, the transistor is rendered nonconductive to deenergize the display element. The illumination or extinction of the display element indicates whether the battery voltage is above or below the reference voltage.

6 Claims, 11 Drawing Figures

BATTERY CHECKER CIRCUIT

BACKGROUND OF THE INVENTION

The invention relates to a battery checker circuit, and more particularly to a circuit which checks the voltage of a storage battery which is used as a drive source in a variety of instruments.

Where a dry cell or a chargeable battery is used as a drive source, it is recognized that the stored energy of the source is gradually dissipated during use, resulting in a decrease in the output voltage of the source. Thus, there must be provided some means for indicating when the battery voltage is reduced below a reference level which is required for the normal and hence safe operation of the associated instrument. While a variety of detection means which detect the battery voltage have been proposed, they are generally complex in arrangement and unstable in operation. It is highly desirable that the battery checker can be constructed in a simple arrangement, using only electrical elements, and provide an accurate indication. Thus it will be convenient if such circuit can be constructed with a combination of the conventional electrical elements in a simple arrangement.

On the other hand, it is known that when a battery checker is constructed incorporating a light emitting display element, there occurs a hysteresis in the illumination versus voltage characteristic of the display element. Specifically, the threshold voltage at which the display element is illuminated during an increasing phase of the battery voltage as when the power switch of an associated instrument is turned on is different from the corresponding level when the battery voltage is decreasing in its value. As a result, there is a difference between the voltage level at which the display element is illuminated and the level at which it is extinguished.

SUMMARY OF THE INVENTION

It is a first object of the invention to provide a simple battery checker circuit which indicates an exhaustion of a source battery by detecting the battery voltage in a purely electrical manner and illuminating a light emitting display element when the voltage is above the reference level required for normal operation of an associated instrument while extinguishing the display element when the battery voltage is reduced below the reference level.

It is a second object of the invention to provide a battery checker circuit which avoids the disadvantage inherent in a purely electrical circuit incorporating a light emitting display element, by eliminating or minimizing a hysteresis in the illumination versus battery voltage characteristic so as to permit the display element to be illuminated and extinguished substantially at the same voltage level.

It is a third object of the invention to provide a battery checker circuit including a capacitor which repeatedly discharges into a voltage comparison circuit, forming a battery checker circuit incorporating a light emitting display element, so as to oscillate the circuit for flashing operation of the display element.

In accordance with the invention, there is provided a battery checker circuit having a very simple circuit arrangement which in a purely electrical manner, checks and displays by illumination, the voltage level of a battery. The circuit includes a constant voltage element or a feedback resistor which prevents a hysteresis phenomenon from occurring in the illumination versus battery voltage characteristic during ascending and descending phases of the battery voltage to thereby stabilize the threshold level of the circuit, thus substantially eliminating a difference between the voltage levels at which the display element is illuminated and extinguished.

In another aspect of the invention, the circuit includes a capacitor to cause an oscillation of the circuit, thus flashing the display element. A change in the period of flashing provides an indication that the battery voltage is approaching the limit value or reference level.

DETAILED DESCRIPTION OF PREFERRED EMBODIMENTS

The battery checker circuit according to the invention essentially comprises a voltage divider including a voltage detection resistor which is connected across a storage battery, a pair of complementary transistors which operate to detect a voltage developed across the detection resistor which is proportional to the battery voltage, and a light emitting display element connected in series with one of the transistors.

Figure 1:
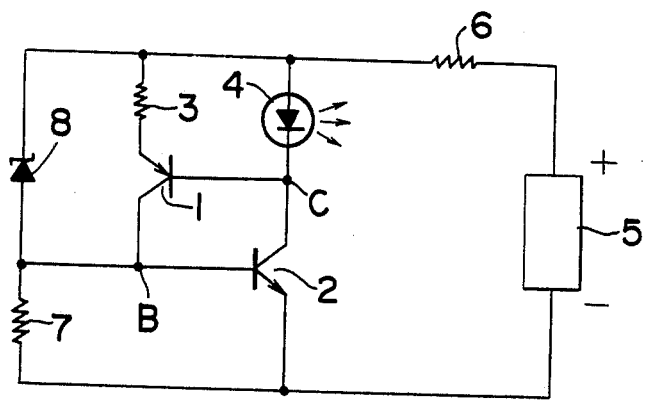
FIG. 1 is a circuit diagram of the battery checker circuit constructed in accordance with one embodiment of the invention.

In the embodiment shown in FIG. 1, a first transistor 1 is of PNP type while a second transistor 2 is a of NPN type, both transistors 1, 2 being connected in complementary circuit configuration. Specifically, the first transistor 1 has its base connected with the collector of the second transistor 2, the base of which is connected with the collector of the first transistor 1. The first transistor 1 has its emitter connected with one end of a resistor 3, the other end of which is connected one terminal of a battery 5 through a resistor 6. The junction between the resistors 3 and 6 is connected with one terminal of a light emitting display element 4 which has its other end connected with the base of the transistor 1 and hence with the collector of the transistor 2. In the present example, the display element 4 is a light emitting diode, but it should be understood that it may equally comprise a conventional lamp or other similar light emitting element. The resistor 6 functions to limit the current flow in the circuit when the display element 4 is initially energized. It will be noted that the second transistor 2 has its emitter connected with the other terminal of the battery 5.

A voltage divider comprises a series combination of a voltage detection resistor 7 and a constant voltage element 8, which is connected to battery 5 through the resistor 6. Specifically, the resistor 7 is connected across the base and emitter of the transistor 2 while the constant voltage element 8 has its one end connected in common with the base of the second transistor 2 and the collector of the first transistor 1 and its other end connected with the junction between the resistors 3, 6 either directly or through a protective resistor (not shown). The values of the resistors 3, 6 and 7 are chosen such that both transistors 1, 2 conduct to permit a flow of an energizing current through the display element 4 when the output voltage of the battery 5 is above a reference level.

In operation, when the battery voltage is above a reference voltage, the voltage developed across the detection resistor 7 which is proportional to the battery voltage, is detected by the transistors 1, 2 which conduct to permit an energizing current to flow through the display element 4, thus illuminating it. This indicates the fact that the output voltage of the battery 5 is above the reference level.

As the battery 5 is dissipated to reduce its output voltage below the reference level, the potential at a junction B between the resistor 7 and the collector of the transistor 1 also decreases. When the potential at the junction B is reduced to a degree such that the transistor 2 can no longer conduct, the potential at a junction C between the display element 4 and the collector of the transistor 2 abruptly increases, whereupon the first transistor 1 ceases to conduct. This takes place instantaneously, and interrupts the current flow through the display element 4, which is therefore extinguished. This indicates the fact that the battery is exhausted to a degree such that its output voltage is below the reference level.

Figure 3:
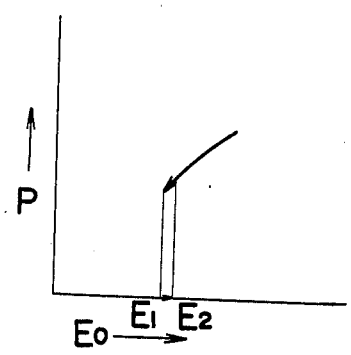
FIG. 3 graphically shows the illumination versus battery voltage characteristic of a light emitting display element which exhibits a hysteresis phenomenon.

In the embodiment shown in FIG. 1, the constant voltage element 8 connected in series with the voltage detection resistor 7 to form the voltage divider functions to stabilize the threshold value of the circuit. If the element 8 is replaced by a fixed resistor, there occurs a difference between the voltage levels at which the display element 4 is illuminated and extinguished, resulting in differential threshold levels of the circuit. This is illustrated in FIG. 3 where the illumination or amount of light emitted by the display element 4, P, on the ordinate is plotted against a battery voltage $E_0$ chosen for the abscissa. In this Figure, it will be noted that the threshold value of the circuit during a descending phase of the battery voltage as occurs when the power switch is turned off is different from that occurring during an ascending phase of the battery voltage as when the power switch is turned on. More specifically, when the battery voltage is deceasing, the circuit will operate to extinguish the display element 4 at a level $E_1$ while it will operate to illuminate the display element 4 at a level $E_2$ when the battery voltage is increasing. Thus there is a difference of $E_2 - E_1$ between the voltage levels at which the display element 4 is illuminated and extinguished. However, such voltage levels must be same. The embodiment shown in FIG. 1 avoids such drawback by using the constant voltage element 8. Though the reason of hysteresis phenomenon is not completely understood, it is believed to be caused by a change in the resistance of the fixed resistor as a result of temperature changes.

Figure 2:
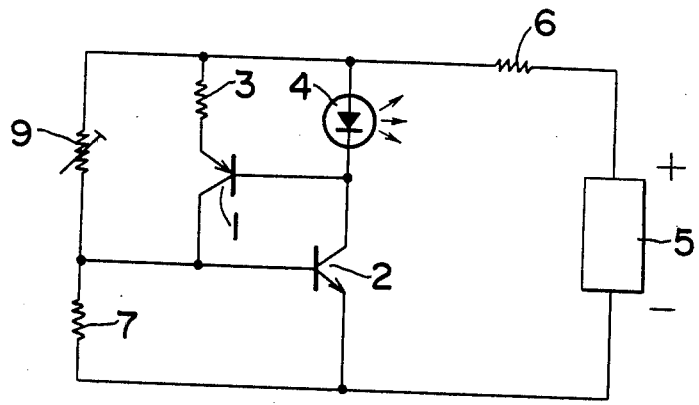
FIG. 2 is a circuit diagram of the battery checker circuit in accordance with another embodiment of the invention.

The circuit arrangement shown in FIG. 2 was originally developed, but the arrangement of FIG. 1 is preferred in minimizing the effect of the hysteresis.

Figure 4:
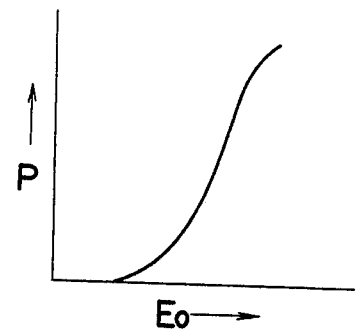
FIG. 4 graphically shows the illumination versus battery voltage characteristic of the display element.
Figure 5:
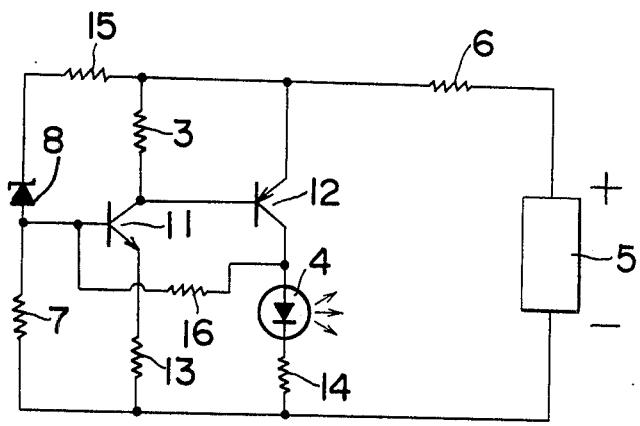
FIGS. 5, 6 and 7 are circuit diagrams showing further embodiments of the invention.

FIG. 4 shows the amount of light, P, emitted by the display element 4, which is plotted against the voltage $E_0$ of the battery 5. It will be appreciated from this illustration that with such response, it is difficult to determine whether or not the battery 5 still as a sufficient capacity. To provide a clear indication, the display element 4 must be operated instantaneously, which is achieved by the embodiment shown in FIG. 5. In this Figure, a first transistor 11 of NPN type and a second transistor 12 of PNP type form a conventional amplifier. Thus, the first transistor 11 has its collector connected with the base of the second transistor 12 and also to the emitter thereof through the resistor 3, and the junction between the resistor 3 and the emitter of the transistor 12 is connected with one terminal of the battery 5 through the current limiting resistor 6. The emitter of the first transistor 11 is connected with the other terminal of the battery 5 through a resistor 13, while the collector of the second transistor 12 is also connected with the other terminal of the battery 5 through a series circuit including the light emitting display element 4 and a resistor 14. A voltage divider, also comprising the constant voltage element 8 and the voltage detection resistor 7, is connected across the battery 5 through the series connected protective resistor 15 and current limiting resistor 6, and the base of the first transistor 11 is connected with the junction between the element 8 and the resistor 7, thus functioning to detect the voltage developed across the resistor 7. A positive feedback resistor 16 is connected between the collector of the transistor 12 and the base of the transistor 11.

In operation, the voltage developed across the resistor 7 is detected by the transistor 11, the output of which is amplified by the second transistor 12. At the same time, a portion of the output from the transistor 12 is positively fed back to the first transistor 11. As a consequence, the energizing current for the display element 4 increases rapidly to cause its instantaneous illumination, thus facilitating accurate determination as to the battery voltage.

Figure 6:
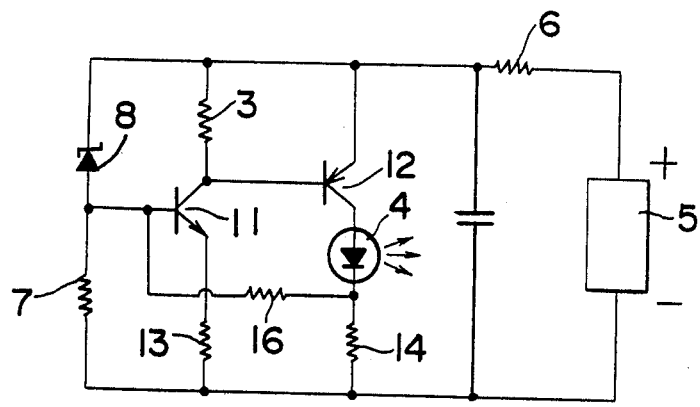

It will be appreciated that instead of connecting resistor 16 to the collector of transistor 12, one end of the positive feedback resistor 16 can be connected to the junction between the display element 4 and the resistor 14, as shown in FIG. 6.

As mentioned previously, the embodiment shown in FIG. 1 uses the constant voltage element 8 in order to avoid the hysteresis phenomenon or the differential voltage levels for the illumination and extinction of the display element 4. However, it will be understood that a current flow of sufficient magnitude must pass therethrough in order to achieve a constant voltage characteristic thereof. This results in a greater current dissipation and a fluctuation of the order of 0.05 volt, for example, in the threshold level, which cannot be neglected. A choice of a greater resistance for the resistor 7 to minimize the current dissipation in the element 8 will degrade its constant voltage characteristic, which results in a gradual decrease in the amount of light emitted by the display element 4 as the battery voltage $E_0$ decreases, thus making it difficult to provide a clear recognition of the extinction of the display element 4.

Figure 7:
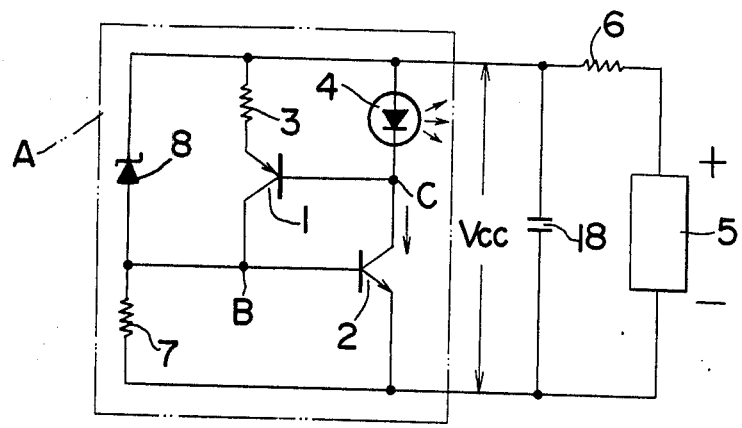
Figure 8:
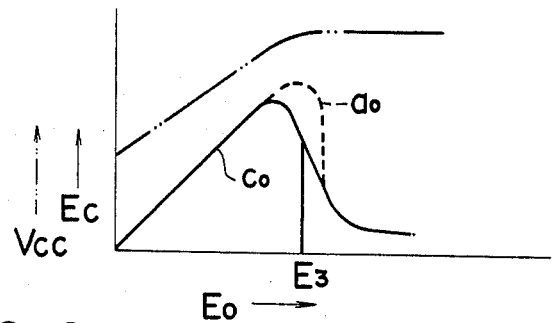
FIG. 8 graphically shows a variation in the voltage at point C shown in the circuit of FIG. 7.

This is illustrated in FIG. 8 where the ordinate stands for the potential Ec at the junction C (FIG. 1), shown in solid line $C_0$, and for a voltage Vcc which is applied across the battery checker circuit, shown in phantom lines, plotted against the battery voltage $E_0$ which is taken on the abscissa. The dotted curve $a_0$ represents the corresponding voltage characteristic when the element 8 affords a satisfactory constant voltage characteristic. It will be seen from FIG. 8 that for a voltage Vcc in excess of the reference level, the potential Ec at the junction C is lowered to permit a current flow through the display element to cause an illumination thereof, but the decrease of the potential at the junction C varies between the solid line curve $C_0$ and the dotted line curve $a_0$ depending on the constant voltage characteristic provided by the element 8. While the response represented by the curve $a_0$ is preferred, this necessitates a relatively high current flow. Such difficulty is overcome by the embodiment shown in FIG. 7 which includes the battery checker circuit shown in FIG. 1 as a voltage comparison circuit A and also includes a capacitor 18 connected across the circuit A. The arrangement is such that the circuit A is caused to oscillate for flashing the display element 4.

When the battery voltage $E_0$ is gradually increased and a voltage level $E_3$ in excess of the reference level is reached (see FIG. 8), both transistors 1, 2 conduct to permit a current flow through the display element 4. A current flow through the display element 4 reduces the entire impedance presented by the circuit A. Denoting the entire impedance by $Z_1$ and the resistance of the resistor 6 by $R_6$, the voltage Vcc applied across the circuit A is represented as follows:

$$Vcc = \frac{Z_1}{Z_1 + R_6} E_0$$

Figure 9:
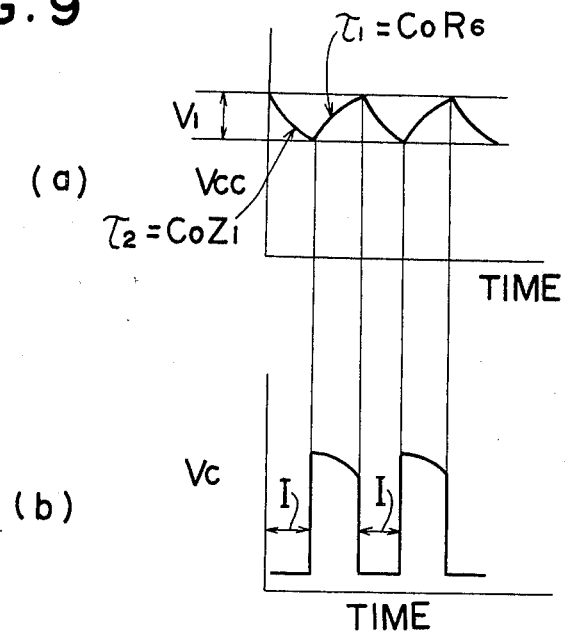
FIGS. 9a and b graphically show the oscillating output waveform of the circuit shown in FIG. 7 and the voltage waveform across the capacitor shown therein.

It will be appreciated that this voltage is reduced relative to a voltage Vc to which the capacitor 18 has been charged, so that it discharges through the circuit A, causing a reduction in the voltage Vcc. A reduction in the voltage Vcc causes the potential at the base of the transistor 2, the junction B, to be reduced, whereby the transistors in the circuit A tend to become non-conductive, increasing the impedance $Z_1$. As a result, the voltge Vcc tends to increase, and the capacitor 18 is charged through the resistor 6 to its initial voltage Vc, whereupon the base voltage of the transistor 2 rises to cause a conduction of the transistors, thus assuming the initial condition. This operation is repeated and the circuit A is in oscillation. As indicated in FIG. 9a, the voltage Vcc varies by an amount $V_1$ as the capacitor 18 charges and discharges, causing a current flow through the display element 4 as shown at I in FIG. 9b. As illustrated in FIG. 9a, the capacitor 18 charges with a time constant of $\tau_1 = C_p R_6$ and discharges with a time constant of $\tau = C_p Z_1$ wherein $C_p$ represents the capacitance of the capacitor 18. By choosing suitable time constants to reduce the time interval between successive intermittent illumination of the display element 4, an apparently continuous illumination thereof can be achieved.

The connection of the capacitor 18 with the voltage comparison circuit A to cause its oscillation is effective to substantially eliminate the hysteresis phenomenon associated with the display element 4, reducing the differential voltage levels for the illumination and extinction thereof to a negligible value on the order of 0.05 to 0.01 volts. When the battery voltage is reduced below the reference level, the display element 4 is instantly extinguished, thus facilitating the discrimination of the battery voltage. The oscillation of the circuit is effective to reduce the current dissipation.

Figure 10:
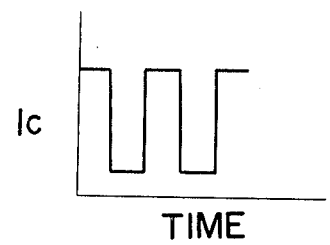
FIGS. 10 and 11 graphically show waveforms of the energizing current which causes a flashing operation of the display element shown in FIG. 7.
Figure 11:
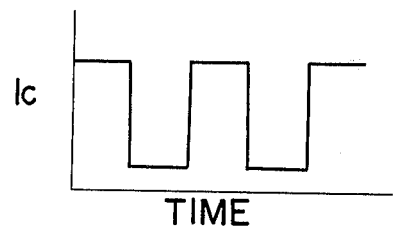

Strictly speaking, the display provided by the embodiment shown in FIG. 7 is a flashing illumination. However, by reducing the values of the time constants $\tau_1$ and $\tau_2$ by choosing suitable values for the circuit parameters $R_6$, $Z_1$ and $C_p$ so as to accelerate the flashing period, an apparently continuous illumination is achieved. Such energizing current Ic is shown in FIG. 10. When the battery voltage is reduced and approaches the reference level, the operating voltage for the circuit is also reduced, so that the oscillation frequency will be reduced as indicated in FIG. 11. The flashing operation at a reduced frequency will be clearly distinguishable by the naked eye, indicating that the output voltage of the battery is approaching the reference level. This warns a user to prepare a fresh battery. It will be understood tht the flashing interval increases as the reference level is approached. The waveform of the energizing current Ic shown in FIG. 10 is depicted for a battery voltage of 2.4 volts while that shown in FIG. 11 is depicted when the battery voltage is reduced to 2.3 volts.

What is claimed is:
1. A battery checker circuit comprising a voltage divider connected across a storage battery, said voltage divider including a first voltage detection resistor, a pair of complementary transistors, a second resistor connecting the emitter of a first one of the pair of transistors with one terminal of the battery; the collector of said first transistor being connected to the voltage detection resistor, and a light emitting display element connected in series with the other one of the pair of transistors across the battery, the base of the first transistor being connected to the junction between the display element and the other transistor, and the base of the other transistor being connected with the collector of the first transistor; a current limiting resistor connected intermediate the battery and the voltage divider and the transistors, and a capacitor connected across the series combination of said current limiting resistor and the battery, said capacitor repeatedly discharging through the series combination of the display element and the other transistor and charging through the current limiting resistor for operating the display element in a flashing manner wherein the rate of flashing is reduced to correspond to a reduction in the battery voltage level.

2. A battery checker circuit according to claim 1 in which the voltage divider further comprises a constant voltage element connected in series with the voltage detection resistor.

3. A battery checker circuit according to claim 1 in which the display element is a light emitting diode.

4. A battery checker circuit comprising a voltage divider connected across a storage battery, said voltage divider including a first voltage detection resistor, a pair of complementary transistors the base of a first one of the pair of transistors being connected to one end of the voltage detection resistor, a second resistor connecting the collector-emitter path of a second one of the pair of transistors across the battery through the base connection of the of said first transistor with the voltage detection resistor, a light emitting display element connected in series with the other transistor, the other one of the pair of transistors having its base connected to the junction between said second resistor and the first transistor, and a positive feedback resistor connected between the collector path of the other transistor to the base of the first transistor; a current limiting resistor connected intermediate the battery and the voltage divider and the transistors, and a capacitor connected across the series combination of said current limiting resistor and the battery, said capacitor repeatedly discharging through the series combination of the display element and the other transistor and charging through the current limiting resistor for operating the display element in a flashing manner wherein the rate of flashing is reduced to correspond to a reduction in the battery voltage level.

5. The battery checker circuit of claim 4 wherein the end of the positive feedback resistor connected to said other transistor collector path is connected to the common junction between the collector of said other transistor and the light emitting display element.

6. The battery checker circuit of claim 4 wherein the end of the positive feedback resistor connected to said other transistor collector path is connected to the common junction between the light emitting display element and the second resistor.

* * * * *